(12) United States Patent
Tzu et al.

(10) Patent No.: US 6,830,853 B1
(45) Date of Patent: Dec. 14, 2004

(54) CHROME MASK DRY ETCHING PROCESS TO REDUCE LOADING EFFECT AND DEFECTS

(75) Inventors: San-De Tzu, Taipei (TW); Sheng-Chi Chin, Hsinchu (TW); Chung-Hsing Chang, Hsin Chu (TW); Hsin-Chang Li, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 186 days.

(21) Appl. No.: 10/213,609

(22) Filed: Aug. 7, 2002

(51) Int. Cl.⁷ .............................. G03F 9/00; G03C 5/00

(52) U.S. Cl. ........................ 430/5; 430/323; 430/324

(58) Field of Search ......................... 430/5, 322, 323, 430/324

(56) References Cited

U.S. PATENT DOCUMENTS

| | | | |
|---|---|---|---|
| 4,774,164 A | 9/1988 | Peavey et al. | 430/296 |
| 5,783,337 A | 7/1998 | Tzu et al. | 430/5 |
| 5,853,923 A | * 12/1998 | Tzu | 430/5 |
| 5,888,678 A | * 3/1999 | Tzu et al. | 430/5 |
| 6,093,507 A | 7/2000 | Tzu | 430/5 |

OTHER PUBLICATIONS

The paper "The Black Silicon Method:High Aspect Ratio Trench Etching for MEMS Applications," by Henri Jansen et al., IEEE , 1996, pp. 250–257.
Proceedings of the Eigth Symposium on Plasma Processing, C. 1990 by the Electrochemical Society, Inc., NY, "Size Dependant Etching of Small Shapes," by H.C. Jones , et al., pp. 45–49.

* cited by examiner

Primary Examiner—Saleha R. Mohamedulla
(74) Attorney, Agent, or Firm—Thomas, Kayden, Horstemeyer & Risley

(57) ABSTRACT

A method of forming photomasks is described which provides good critical dimension control for critical pattern elements and provides good throughput and low defect levels for etching relatively large areas of opaque material. The pattern is first modified to form a frame around the pattern elements which require good critical dimension control. The opaque material, such as chrome, in this frame is then etched away using dry anisotropic etching. The dry anisotropic etching provides good critical dimension control. The remainder of the opaque material to be removed is then etched away using wet isotropic etching. The wet isotropic etching provides good defect control in this region of the mask and good throughput. This method provides good critical dimension control at the edges of the pattern elements, good throughput in mask fabrication, and good defect level control in removing the relatively large areas of opaque material which do not affect critical dimension control.

20 Claims, 5 Drawing Sheets

100## CHROME MASK DRY ETCHING PROCESS TO REDUCE LOADING EFFECT AND DEFECTS

BACKGROUND OF THE INVENTION (1) Field of the Invention

This invention relates to a method of forming a mask which provides good critical dimension control, low defect levels, and maintains good throughput.

(2) Description of the Related Art

Wet isotropic etching and dry anisotropic etching are important processes for mask fabrication. Wet isotropic etching has the advantage of increased throughput while dry anisotropic etching has the advantage of improved critical dimension control.

U.S. Pat. No. 4,774,164 to Peavey et al. describes patterning a chrome mask with polybutenesulfone, PBS, photoresist. The photoresist is patterned and covered with glass. The glass is etched down to the thickness of the photoresist transferring the pattern to the glass. The photoresist is then removed and the remaining glass is used as a mask for etching the pattern in the chrome mask.

U.S. Pat. No. 5,738,337 to Tzu et al. describes a process for forming an attenuated phase-shifting photomask. Multiple exposure doses are used to expose a layer of resist material in forming the photomask.

U.S. Pat. No. 6,093,507 to Tzu describes a simplified process for fabricating Levinson and chromeless type phase shifting masks.

SUMMARY OF THE INVENTION

As critical dimensions in integrated circuit fabrication become smaller, such as in the range of 0.13 to 0.15 microns, dry anisotropic etching in the fabrication of chrome masks becomes necessary. While the dry anisotropic etching in the fabrication of chrome masks maintains the critical dimension tolerance, the process has low throughput and is subject to high defect levels when relatively large areas of chrome are etched away. While the defect levels for etching relatively large areas of chrome can be controlled using isotropic wet etching of chrome, the isotropic nature of the wet etching can not maintain adequate critical dimension control.

It is a principle objective of this invention to provide a method of fabrication of masks which combines the advantages of wet isotropic etching and dry anisotropic etching to maintain good critical dimension control, adequate throughput, and good defect levels for etching of relatively large areas of opaque material.

This objective is achieved by forming a frame around the pattern elements which require good critical dimension control. The opaque material, such as chrome, in this frame is then etched away using dry anisotropic etching. The remainder of the opaque material to be removed is then etched away using wet isotropic etching. This maintains good critical dimension control at the edges of the pattern elements, good throughput in mask fabrication, and good defect level control in removing the relatively large areas of opaque material which do not affect critical dimension control.

DESCRIPTION OF THE PREFERRED EMBODIMENTS

Figure 1:
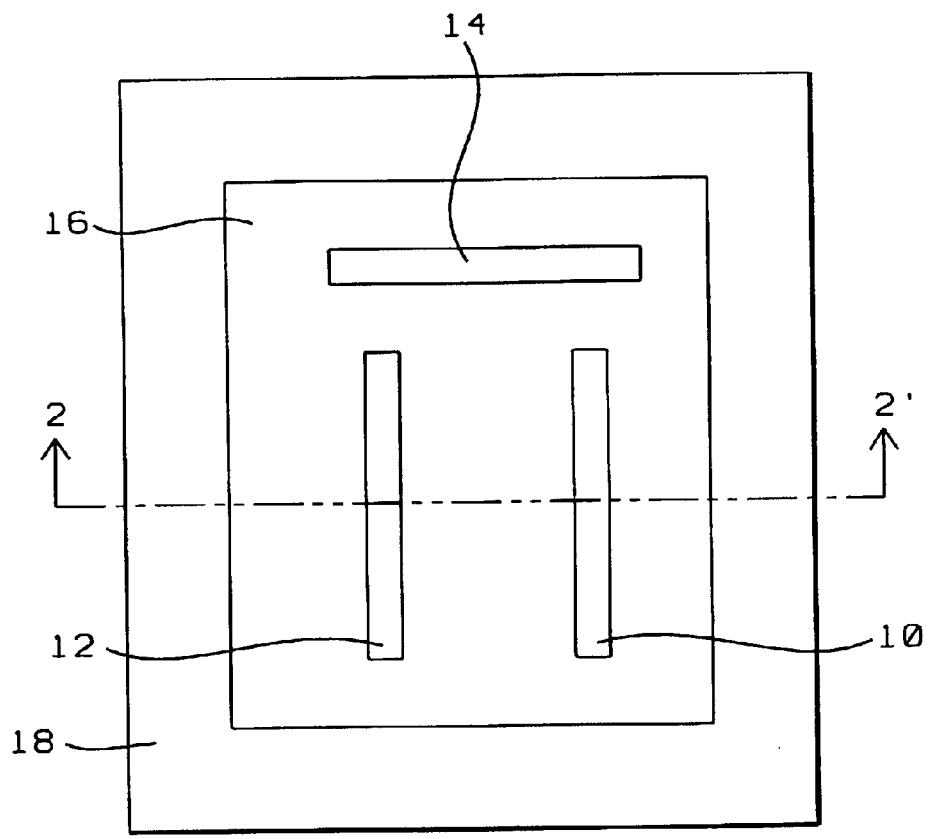
FIG. 1 shows a top view of a mask pattern to be fabricated using the methods of this invention.

Refer now to FIGS. 1–12 for a description of the preferred embodiments of the methods of fabricating masks of this invention. FIG. 1 shows a top view of a mask showing a pattern having a number of pattern elements 10, 12, and 14 formed of opaque material, such as chrome. There is an opaque border region 18, formed of an opaque material such as chrome, surrounding the pattern elements 10, 12, and 14. The remainder of the mask pattern is transparent material 16, such as the transparent mask substrate. In this pattern the dimensions of pattern elements 10, 12, and 14 are critical and the edge definition of the pattern elements 10, 12, and 14 must be accurate and will be formed using dry anisotropic etching. The edge definition of the border region 18 is less critical and will be formed using wet isotropic etching.

Figure 2:
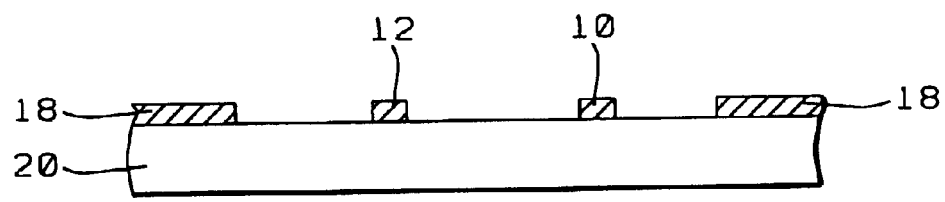
FIG. 2 shows a cross section view of the mask pattern of FIG. 1 taken along line 2–2' of FIG. 1.

FIG. 2 shows a cross section of the mask shown in FIG. 1 taken along the line 2–2' of FIG. 1. FIG. 2 shows the pattern elements 10 and 12 and the border region 18 formed of opaque material on a transparent mask substrate 20. In this example the opaque material is a material such as chrome or the like and the transparent mask substrate is formed of a material such as quartz or the like.

Figure 3:
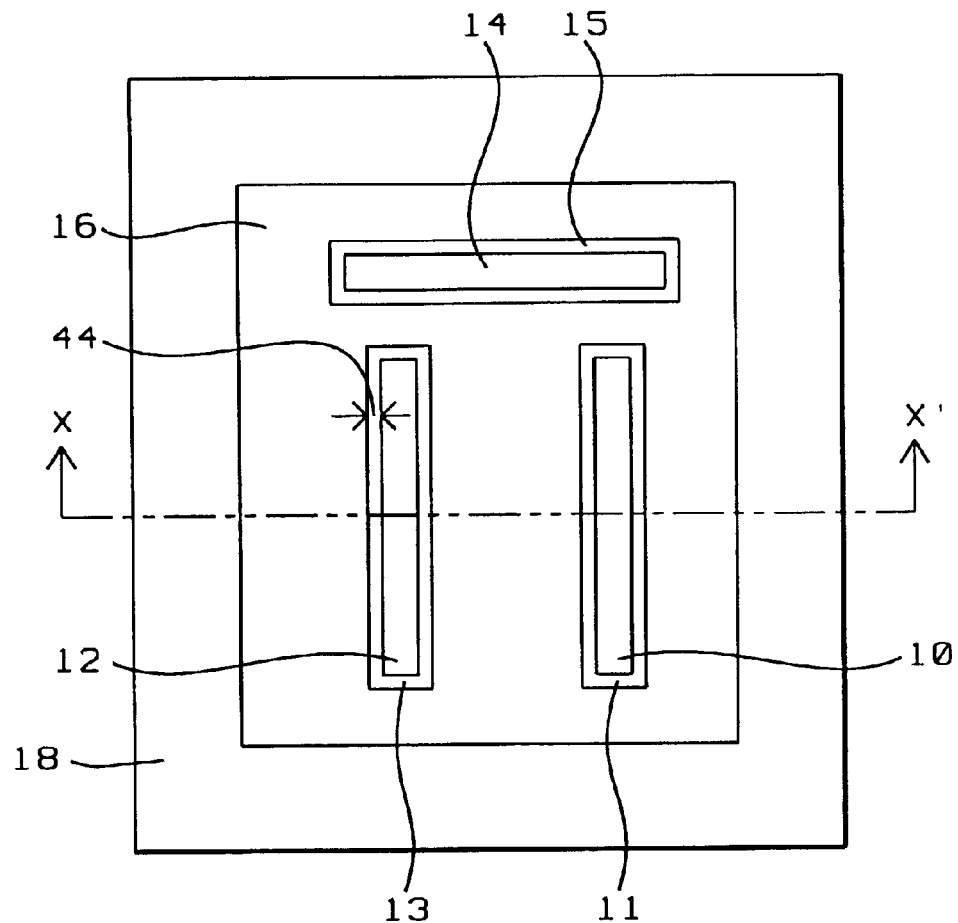
FIG. 3 shows a top view of the mask pattern to be fabricated using the methods of this invention showing a frame region around the pattern elements which require good critical dimension control.

FIG. 3 shows a top view of a modified pattern showing modifications made to the pattern for the implementation of the method of this invention. The modifications to the pattern are the formation of frame regions 11, 13, and 15 around each of the pattern elements 10, 12, and 14. The frame regions of the image formed by the mask have a width 44 of between about 0.05 and 0.25 microns, so that the width 44 of the frame regions on the mask, for a 4× reduction mask, is between about 0.2 and 1.0 microns. There is one frame region around each of the pattern elements, frame region 11 around pattern element 10, frame region 13 around pattern element 12, and frame region 15 around pattern element 14. FIGS. 4–12 will show cross section views of the mask taken along line X—X' of FIG. 3 in order to describe the process steps of this invention.

Figure 4:
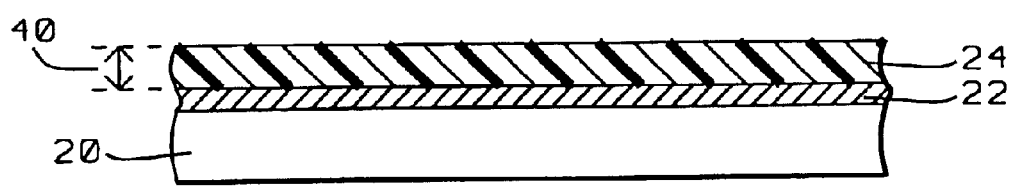
FIG. 4 shows a cross section view of a cross section of a mask blank having a layer of first resist formed thereon.

FIG. 4 shows a cross section view of a mask blank having a transparent mask substrate 20, such as quartz, with a layer of opaque material 22, such as chrome, formed thereon. A layer of first resist 24, having a first thickness 40, is formed on the layer of opaque material 22. In this example the resist is electron beam resist and the exposure will be accomplished using an electron beam exposure system. Those skilled in the art will readily recognize that other resists and other exposure methods could be used.

Figure 5:
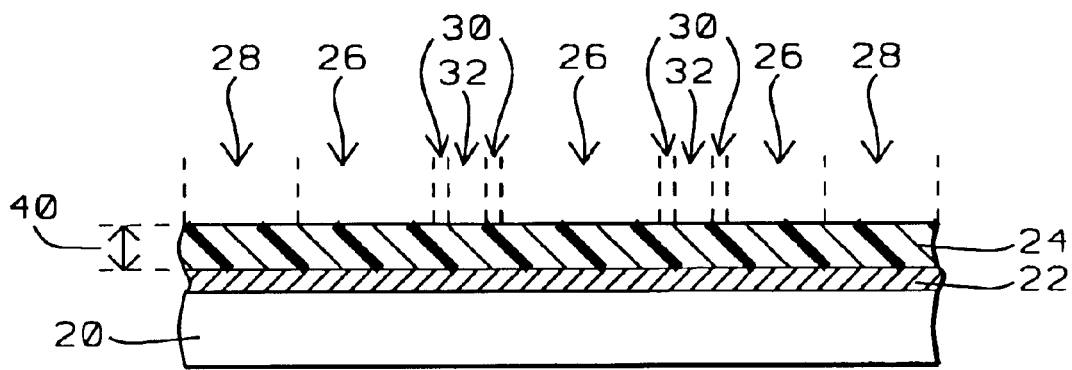
FIG. 5 shows a cross section view of the mask wherein the first resist layer is being exposed with multiple exposure doses using electron beam exposure methods.

FIG. 5 shows the exposure of the first layer of resist 24 using an electron beam 34, or a beam of other exposing energy. In the exposure of the first layer of resist 24 the region 30 of the resist corresponding to the frame regions, reference numbers 11 and 13 in FIG. 3, are exposed using a first exposure dose; the region 28 of the resist corresponding to the border region, reference number 18 in FIG. 3, and the region 32 of the resist corresponding to the pattern elements, reference numbers 10 and 12 in FIG. 3, are not exposed; and the remainder 26 of the resist is exposed with a second exposure dose. The second exposure dose is less than the first exposure dose. The first exposure dose is sufficient to expose the entire first thickness 40 of the first layer of resist 24. The second exposure dose is not sufficient to expose the entire first thickness 40 of the first layer of resist 24. Although not shown in FIG. 5, the region of the resist corresponding to the frame region identified by reference number 15 in FIG. 3 is exposed using the first exposure dose and the region of the resist corresponding to the pattern element identified by reference number 14 in FIG. 3 is not exposed.

Figure 6:
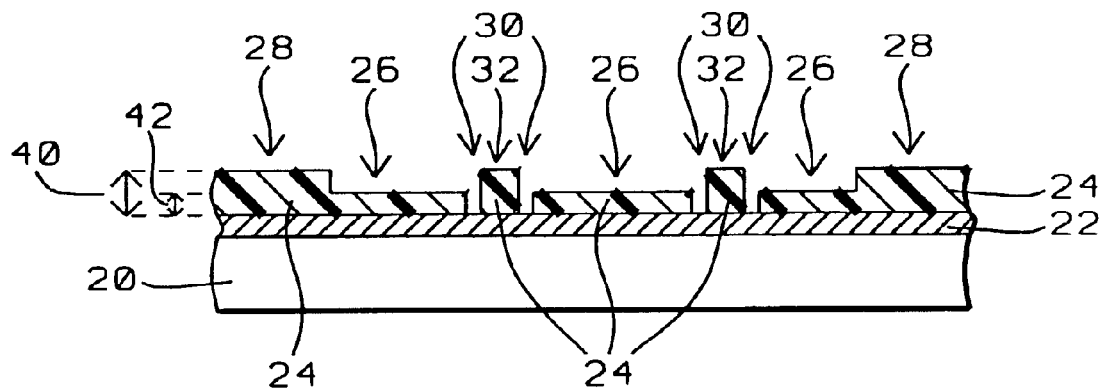
FIG. 6 shows a cross section view of the mask blank after the first resist layer has been developed to form a first resist mask.

Next, as shown in FIG. 6, the first layer of resist 24 is developed leaving no resist remaining in the region 30 of the resist corresponding to the frame regions, reference numbers 11 and 13 in FIG. 3; the full first thickness 40 of the first layer of resist 24 in the region 28 of the resist corresponding to the border region, reference number 18 in FIG. 3, and the region 32 of the resist corresponding to the pattern elements, reference numbers 10 and 12 in FIG. 3; and a second thickness of resist 42 in that part 26 of the first layer of resist 24 over the remainder of the pattern, reference number 16 in FIG. 3. Although not shown in FIG. 6, no resist remains in the region of the resist corresponding to the frame region identified by reference number 15 in FIG. 3 and the full first thickness of the resist in the region of the resist corresponding to the pattern element identified by reference number 14 in FIG. 3. This development of the first layer of resist forms the first resist mask.

Figure 7:
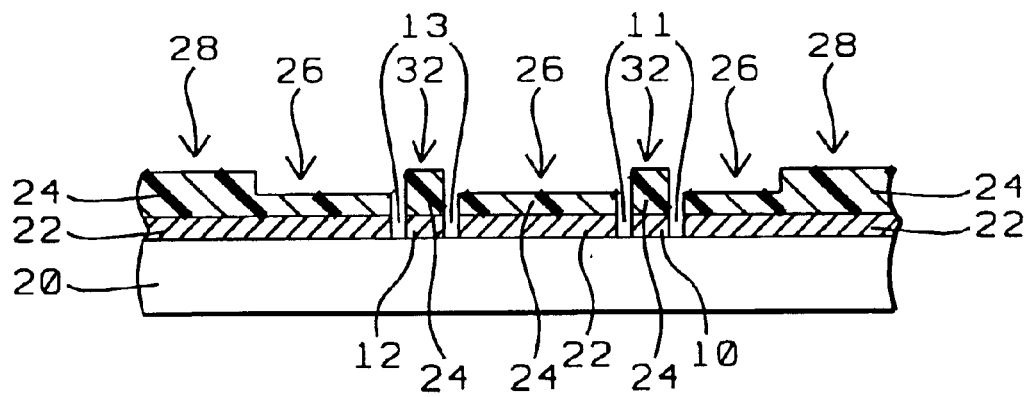
FIG. 7 shows a cross section view of the mask blank after the frame regions have been etched using dry anisotropic etching and the first resist mask.

Next, as shown in FIG. 7, that part of the layer of opaque material 22 in the frame regions 11 and 13 of the mask is etched away using dry anisotropic etching. In this example the dry anisotropic etching uses an etchant of $Cl_2/O_2$. This is a key step of the invention because the dry anisotropic etching of the frame regions forms the pattern edges of the pattern elements 10 and 12 with great accuracy. Although not shown in FIG. 7, that part of the opaque material in the frame region identified by reference number 15 in FIG. 3 is also etched away during this etching step forming pattern edges of the pattern-element identified by reference number 14 in FIG. 3 with great accuracy.

Figure 8:
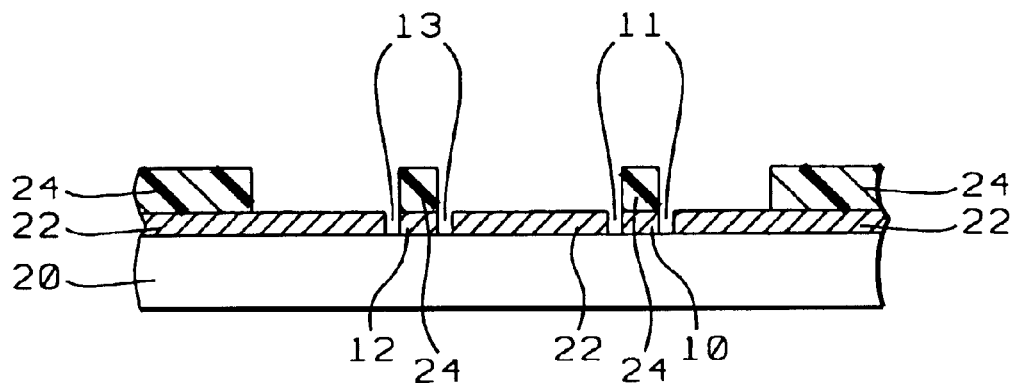
FIG. 8 shows a cross section view of the mask blank after the first resist mask has been partially etched away using an $O_2$ plasma etch.

Next, as shown in FIG. 8, an amount of the first layer of resist equal to the second thickness, reference number 42 in FIG. 6, is etched away using an $O_2$ plasma etch. This leaves resist 24 only over the pattern elements 10 and 12 and the border region, reference number 18 in FIG. 3, thereby forming a second resist mask. Although not shown in FIG. 8 resist also remains over the pattern element identified by reference number 14 in FIG. 3 in the second resist mask. In a first embodiment of the invention that part of the opaque material not covered by resist in the second resist mask, reference number 16 in FIG. 3, is etched away using wet isotropic etching. In this example the wet isotropic etching uses an etchant of $Cl_x(NO_3)_y(ClO_4)_z$. The resist is then stripped leaving the completed mask shown in cross section in FIG. 12. The top view of the completed mask is shown in FIG. 1.

Figure 9:
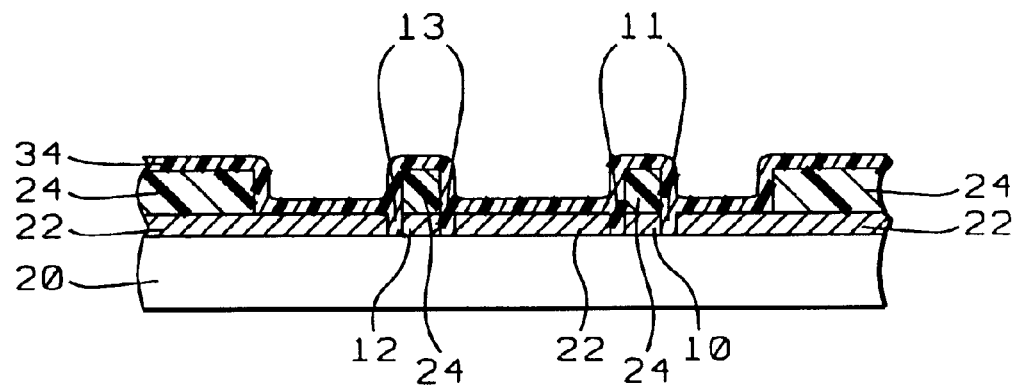
FIG. 9 shows a cross section view of the mask blank of FIG. 8 after a second resist layer has been formed.
Figure 10:
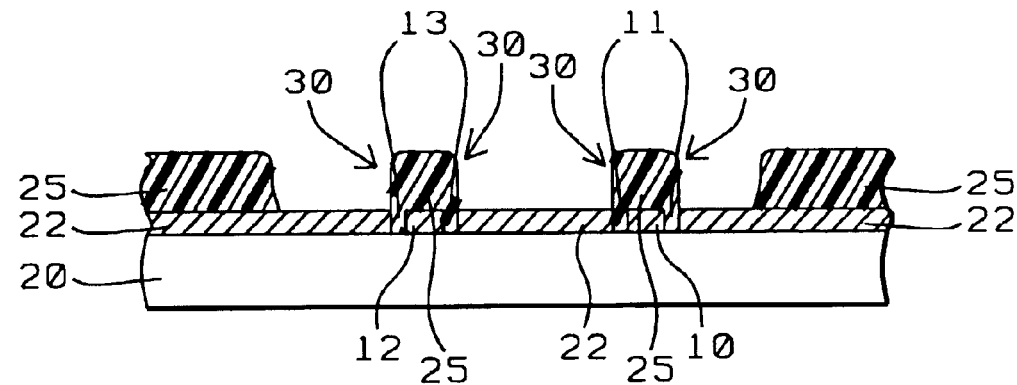
FIG. 10 shows a cross section view of the mask blank of FIG. 9 after the first resist layer and the second resist layer have been back etched to form a second resist mask.

In a second embodiment of this invention after the second resist mask is formed as shown in FIG. 8, and before the wet isotropic etching is carried out, a second resist layer is formed over the mask. FIG. 9 shows the second resist layer 34 over the mask covering the frame regions 11 and 13. Although not shown in FIG. 9 the frame region identified by reference number 15 in FIG. 3 is also covered by the second resist layer. Next, as shown in FIG. 10, the first and second resist is back etched leaving resist 25 only over the pattern elements 10 and 12, the frame regions 11 and 13, and the border region, reference number 18 in FIG. 3, thereby forming a third resist mask. Although not shown in FIG. 10, the second resist mask also leaves resist over the pattern element identified by reference number 15 in FIG. 3 and the frame region identified by reference number 15 in FIG. 3.

Figure 11:
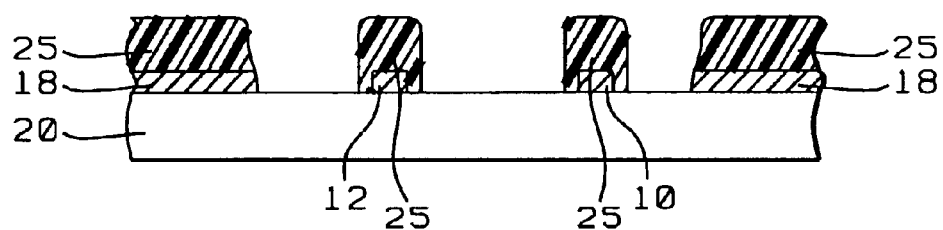
FIG. 11 shows a cross section view of the mask after the larger areas of the opaque material have been etched away using wet isotropic etching and the second resist mask.
Figure 12:
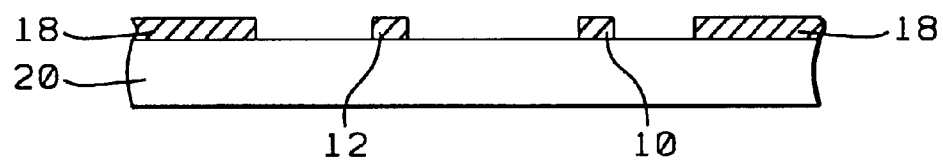
FIG. 12 a cross section view of the completed mask after the remaining first resist and second resist have been removed.

Next, as shown in FIG. 11, that part of the opaque material not covered by resist in the third resist mask, reference number 16 in FIG. 3, is etched away using wet isotropic etching. In this example the wet isotropic etching uses an etchant of $Cl_x(NO_3)_y(ClO_4)_z$. The resist is then stripped leaving the completed mask shown in cross section in FIG. 12. The top view of the completed mask is shown in FIG. 1. This embodiment provides even greater accuracy for the dimensions of the pattern elements because in this embodiment the edges of the pattern elements are protected from the etchant used in the wet isotropic etching by the third resist mask.

While the invention has been particularly shown and described with reference to the preferred embodiments thereof, it will be understood by those skilled in the art that various changes in form and details may be made without departing from the spirit and scope of the invention.

What is claimed is:

1. A method of forming masks, comprising:
   providing a transparent mask substrate having a layer of opaque material formed on said transparent mask substrate, and a layer of first resist having a first thickness formed on said layer of opaque material;
   providing a pattern having a number of first pattern elements, a frame region around each of said first pattern elements, and a border region around all of said first pattern elements and said frame regions;
   forming a first resist mask in said layer of resist wherein said first resist mask has said first thickness of said resist over said first pattern elements, said first thickness of said resist over said border region, no resist over said frame regions, and a second thickness of said resist over the remainder of said pattern, wherein said second thickness is less than said first thickness;
   etching away that part of said layer of opaque material in said frame regions using said first resist mask and dry anisotropic etching;

etching away said second thickness of said layer of resist, thereby forming a second resist mask having said resist only over said first pattern elements and said border region;

etching away the remaining said opaque material not covered by said second resist mask using said second resist mask and wet isotropic etching; and removing said second resist mask.

2. The method of claim 1 wherein said opaque material is chrome.

3. The method of claim 1 wherein said frame regions around each of said first pattern elements has a width of between about 0.2 and 1 micron when said method is used to form 4× reduction mask.

4. The method of claim 1 wherein said etching away said second thickness of said layer of resist uses an $O_2$ plasma etch.

5. The method of claim 1 wherein said dry anisotropic etching uses an etchant of $Cl_2/O_2$.

6. The method of claim 1 wherein said wet isotropic etching uses an etchant of $Cl_x(NO_3)_y(ClO_4)_z$.

7. The method of claim 1 wherein said forming said first resist mask comprises:

exposing that part of said layer of resist in said frame region with a first exposure dose using an electron beam exposure system, wherein said first exposure dose is sufficient to expose the entire said first thickness of said layer of resist;

exposing that part of said layer of resist in said pattern except for said first pattern elements, said frame region, and said border region with a second exposure dose using said electron beam exposure system, wherein said second exposure dose is less than said first exposure dose and is sufficient to expose a thickness of said layer of resist equal to said second thickness substracted from said first thickness; and developing said layer of resist after said layer of resist has been exposed by said first exposure dose and said second exposure dose.

8. The method of claim 1 wherein said resist is an electron beam resist.

9. The method of claim 1 wherein said transparent mask substrate is quartz.

10. A method of forming masks, comprising:

providing a transparent mask substrate having a layer of opaque material formed on said transparent mask substrate, and a layer of first resist having a first thickness formed on said layer of opaque material;

providing a pattern having a number of first pattern elements, a frame region around each of said first pattern elements, and a border region around all of said first pattern elements and said frame regions;

forming a first mask in said layer of first resist wherein said first mask has said first thickness of said layer of first resist over said first pattern elements, said first thickness of said layer of first resist over said border region, none of said layer of first resist over said frame regions, and a second thickness of said layer of first resist over the remainder of said pattern, wherein said second thickness is less than said first thickness;

etching away that part of said layer of opaque material in said frame regions using said first mask and dry anisotropic etching;

etching away said second thickness of said layer of first resist, thereby forming a second mask having said first resist only over said first pattern elements and said border region;

forming a layer of second resist over said second mask, thereby forming said second resist over said frame region;

back etching said layer of second resist, thereby leaving said second resist over said frame region, leaving said first resist over said first pattern elements, leaving said first resist over said border region, and removing all said first resist and said second resist from the remainder of said pattern, thereby forming a third mask;

etching away the remaining said opaque material not covered by said third mask using said third mask and wet isotropic etching; and removing said third mask.

11. The method of claim 10 wherein said opaque material is chrome.

12. The method of claim 10 wherein said frame regions around each of said first pattern elements has a width of between about 0.2 and 1 micron when said method is used to form 4× reduction mask.

13. The method of claim 10 wherein said etching away said second thickness of said layer of resist uses an $O_2$ plasma etch.

14. The method of claim 10 wherein said dry anisotropic etching uses an etchant of $Cl_2/O_2$.

15. The method of claim 10 wherein said wet isotropic etching uses an etchant of $Cl_x(NO_3)_y(ClO_4)_z$.

16. The method of claim 10 wherein said forming said first mask comprises:

exposing that part of said layer of first resist in said frame region of said pattern with a first exposure dose using an electron beam exposure system, wherein said first exposure dose is sufficient to expose the entire first thickness of said layer of first resist;

exposing that part of said layer of resist in said pattern except for said first pattern elements, said frame region, and said border region with a second exposure dose using said electron beam exposure system, wherein said second exposure dose is less than said first exposure dose and is sufficient to expose a thickness of said layer of resist equal to said second thickness substracted from said first thickness; and developing said layer of first resist after said layer of first resist has been exposed by said first exposure dose and said second exposure dose.

17. The method of claim 10 wherein said resist is an electron beam resist.

18. The method of claim 10 wherein said first resist and said second resist are the same.

19. The method of claim 1 wherein said transparent mask substrate is quartz.

20. A method of forming a mask, comprising:

providing a transparent mask substrate having a layer of opaque material formed on said transparent mask substrate, said transparent mask substrate defined with a pattern element region, a frame region around said pattern element region, and a remainder region around said frame region;

forming a first mask on said layer of opaque material, said first mask having a first part with a first thickness disposed on said pattern element region and a second part with a second thickness, which is less than said first thickness, disposed on said remainder region;

performing a first etching process to remove parts of said layer of opaque material in said frame region uncovered by said first mask;

removing said second part of said first mask to form a second mask; and forming a third mask in the frame region around said layer of opaque material in the pattern element region;

performing a second etching process to remove parts of said layer of opaque material in said remainder region uncovered by said second mask and third mask;

wherein said first etching process has a better critical dimension control and less throughput than said second etching process.

\* \* \* \* \*